United States Patent [19]

Wright

[11] 4,170,326
[45] Oct. 9, 1979

[54] METHOD AND HOLDING FIXTURE FOR SOLDERING LEAD FRAMES TO HYBRID SUBSTRATES

[75] Inventor: Stanley J. Wright, Albuquerque, N. Mex.

[73] Assignee: GTE Automatic Electric Laboratories Incorporated, Northlake, Ill.

[21] Appl. No.: 868,081

[22] Filed: Jan. 9, 1978

[51] Int. Cl.² .............................................. B23K 1/08
[52] U.S. Cl. ........................................ 228/37; 228/38; 228/40; 228/180 R
[58] Field of Search ....................... 228/36, 37, 38, 40, 228/180 R, 212

[56] References Cited

U.S. PATENT DOCUMENTS

| | | | |
|---|---|---|---|
| 1,460,549 | 7/1923 | Langdon | 228/40 |
| 3,000,342 | 9/1961 | Dorosz et al. | 228/40 |
| 3,606,132 | 2/1970 | Rinaldi et al. | 228/36 |
| 3,765,591 | 10/1973 | Cook | 228/36 |

Primary Examiner—Francis S. Husar
Assistant Examiner—Kenneth J. Ramsey
Attorney, Agent, or Firm—Russell A. Cannon

[57] ABSTRACT

A fixture is provided for holding a hybrid substrate having a plurality of components already soldered to conductive patterns and/or lands on the front side thereof and having fingers of a lead frame pressed over one edge thereof for dip soldering lead frame fingers to lands. The fixture comprises a flat plate having a plurality of titanium clips or hook elements extending below the bottom edge of the plate, assembled hybrid substrates being loaded into the fixture with the base of the lead frame resting on the hooks. Slots cut in the front of the plate define a rib that extends over the length of the plate near the bottom edge. The rib contacts the backside of a substrate to form an air gap that prevents flux and solder wicking up it. A hinged cover rests against components on a substrate to hold the latter in place. Only the hook ends of the titanium clips, the lead frame, and a portion of the substrate adjacent the one edge are dipped into molten solder to solder lead fingers to associated lands. A two-piece mounting assembly on one side of the plate provides adjustment for making the one edge of the substrate and base of the lead frame parallel to the surface of the solder.

16 Claims, 8 Drawing Figures 4,170,326

METHOD AND HOLDING FIXTURE FOR SOLDERING LEAD FRAMES TO HYBRID SUBSTRATES

BACKGROUND OF INVENTION

This invention relates to hybrid manufacturing techniques, and more particularly to improved method and apparatus for soldering lead frames to conductive lands on hybrid substrates already having components soldered thereto.

A hybrid circuit assembly is essentially an electrical circuit formed on a dielectric substrate. It generally comprises a rectangularly shaped glass-ceramic substrate having resistors, electrically conductive circuit patterns, and conductive lands formed on the front side thereof; with other circuit elements being soldered to selected points on the patterns and leads being soldered to the lands which are located adjacent to one edge of the substrate. A prior-art technique of producing such a hybrid circuit assembly is to form the patterns, lands and resistive elements on the substrate, and then press fingers of a lead frame over the one edge of the substrate and associated lands. The base or bar on the lead frame is clamped in a holder of a rotary dipping convey machine such as the model RHV-360 sold by Hollis Engineering, Incorporated, of Nashua, N.H., under the trademark Acculine. The machine rotates the substrate 180° in the vertical plane, and then completely immerses the entire hybrid and the lead frame in flux and molten solder to attach leads to lands and tin the circuit patterns. Components are then set out on the pre-soldered substrate and passed through a reflow solder operation to solder them to the circuit patterns. An alternate technique is to solder electrical components to patterns on the substrate prior to attaching leads thereto. After an operator presses lead frame fingers over the one edge of a substrate and adjacent lands, a clothespin is snapped onto the substrate. The clothespin is held by hand as an operator hopefully dips only the lead frame, substrate one edge and lands into molten solder. Since such a hand operation is done with individual substrates, it is time consuming and fatiguing to an operator. It is also unreliable in that when a substrate is misaligned in the solder or held there for too long a time interval, then components already soldered to the substrate may fall off or be moved out of alignment with the circuit patterns.

An object of this invention is the provision of improved method and apparatus for soldering leads to hybrid substrates.

SUMMARY OF INVENTION

In accordance with this invention, in a dip solder machine, apparatus for holding hybrid assemblies including substrates with conductive lands formed on one side thereof and adjacent to one edge thereof with at least some conductive fingers on a lead frame pressed over the one edge of the substrate and contacting associated lands, and which may have electrical components soldered to conductive patterns on the substrate, during machine implemented dip solder of lead fingers to associated lands, comprises: a first plate; a plurality of hook elements each comprising a relatively straight shank portion connecting one end portion thereof to a curved hook portion having a base and an arm extending from the base in the general direction of the shank portion; and means for attaching the one end portion of said hook elements to said plate with the hook portions opening in the same one direction and their bases all in the same one line that is substantially perpendicular to the one direction; a substrate with a lead frame pressed thereon being loaded into the hook elements with a lead frame base contacting hook portion bases with the substrate extending above the hook portion bases, the hook portions and the lead frame and the one edge of the substrate and adjacent lands being placed in molten solder in the direction opposite the one direction to solder lead fingers to associated opposite the one direction to solder lead fingers to associated lands.

DESCRIPTION OF DRAWINGS

This invention will be more fully understood from the following detailed description thereof together with the drawings in which.

DESCRIPTION OF PREFERRED EMBODIMENTS

Figure 1:
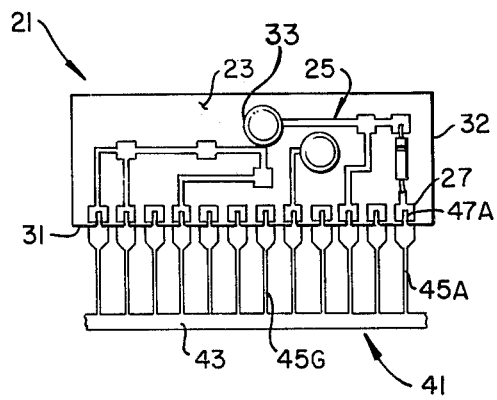
FIG. 1 is plan view of a hybrid circuit 21 having electrically conductive circuit patterns 25 formed on a substrate 23 with components soldered to points of the patterns, and fingers 47 of a lead frame 41 pressed over one edge 31 of the substrate and lands 27 thereon.
Figure 2:
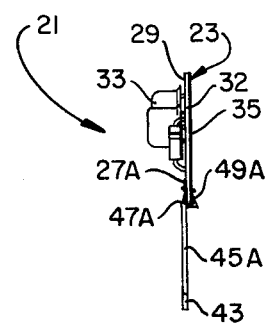
FIG. 2 is a right side view of the hybrid circuit 21 in FIG. 1.

Referring now to FIGS. 1 and 2, a hybrid circuit assembly 21 comprises a substrate 23 having electrically conductive circuit patterns 25 and conductive lands 27 formed on the front-side 29 thereof, with the lands being adjacent the longitudinal bottom edge 31. The ceramic substrate 23 typically measures from 0.4 inch × 1.0 inch to 2.0 inch × 2.0 inch. The leads of components are soldered to points in the circuit patterns by reflow soldering, for example. The fingers 47 and 49 of leads 45 in a lead frame assembly 41 are forced over the bottom edge 31 of the substrate so that fingers 47 contact associated lands 27. It is not necessary for a land 27 to be associated with each of the leads 45. All of the leads 45 in a lead frame 41 are initially held in place by a base or bar 43 which extends approximately 0.420 inch below the bottom 31 of the substrate. It is desirable to attach leads 45 to the substrate by soldering fingers 47 to associated lands 27 without unsoldering components that are spaced as close as 0.020 inch from lands 27.

Although only one substrate 23 is shown in FIG. 1 and described here for simplicity of illustration, the practice is to simultaneously fabricate several (say three) hybrid circuits 21 on scored substrates which are still connected together on side edges 32 thereof. This means that a single lead frame 41 is pressed onto all of the connected substrates and soldered to lands thereon. The substrates are separated later in the conventional manner. It is understood that the disclosed embodiment of this invention may be employed to solder lead frames to hybrid circuits on single or multiple substrates by merely adjusting the dimensions and placement of elements thereof.

Figure 3:
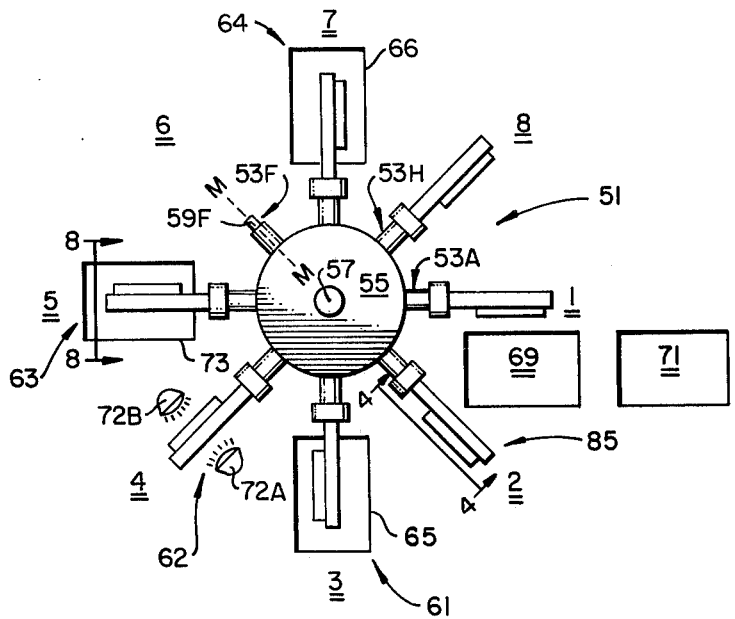
FIG. 3 is a top view of a machine 51 for soldering lead frame 41 to substrate 23 and embodying this invention.
Figure 8:
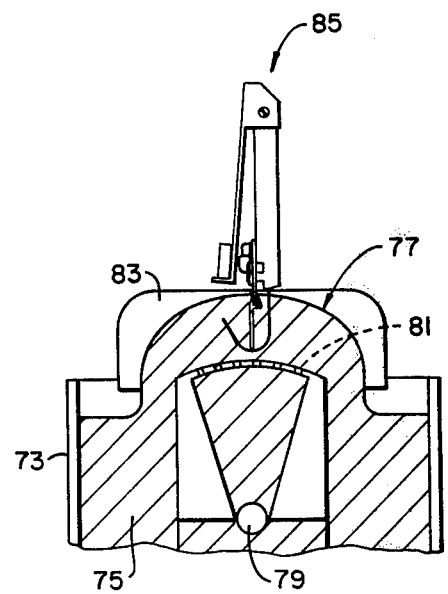
FIG. 8 is a section view of the wave solder station 63 taken along line 8—8 in FIG. 3.
Figure 4:
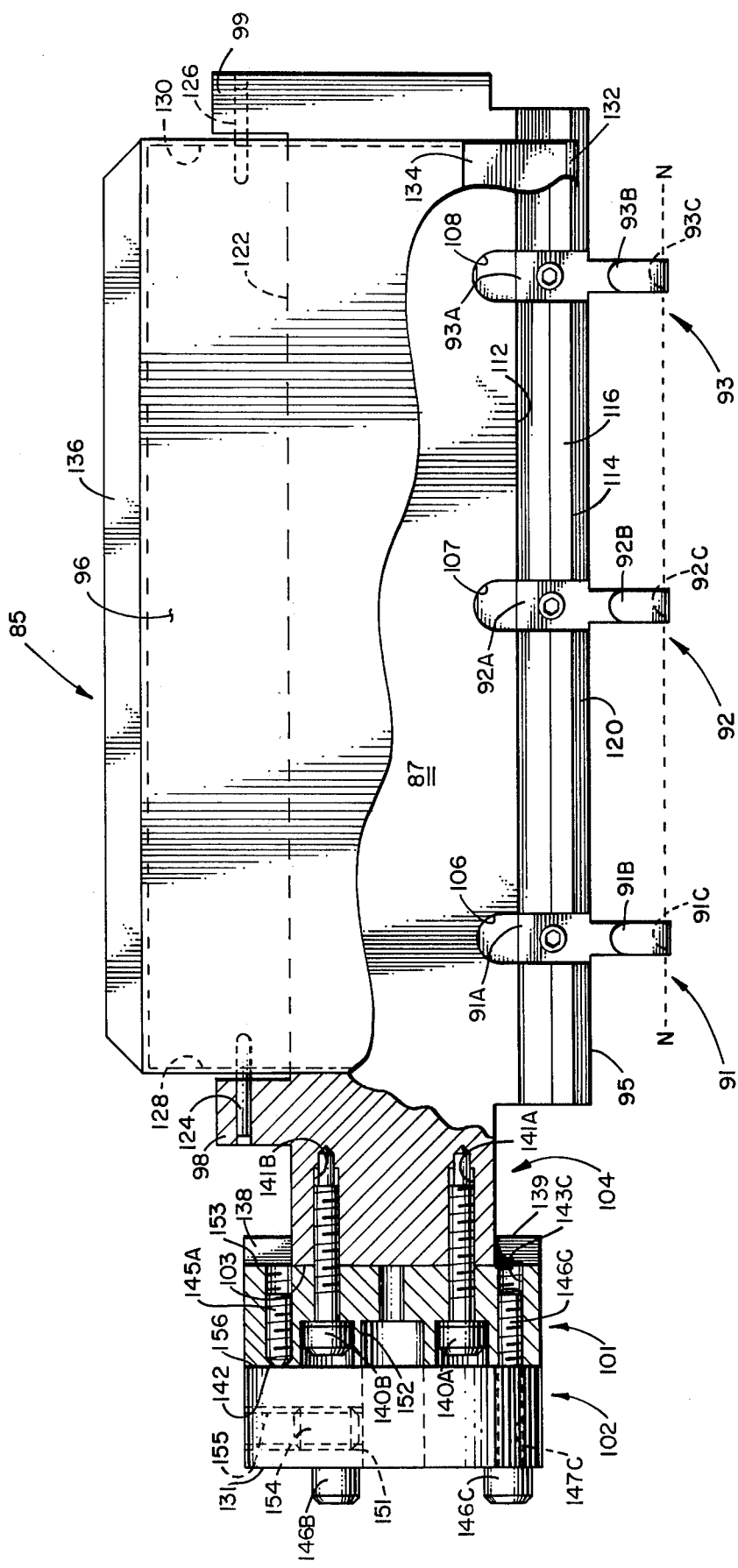
FIG. 4 is a front elevation view of a holding fixture 85 embodying this invention, taken along line 4—4 in FIG. 3, with a portion of the left side thereof cut away.
Figure 5:
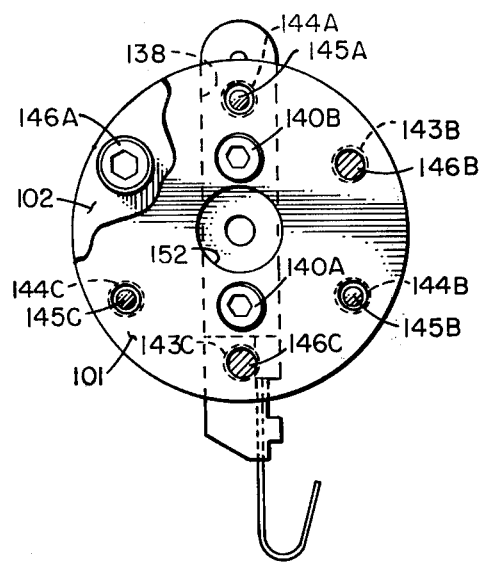
FIG. 5 is a left-side elevation view of the holding fixture 85 in FIG. 4 with the part 102 cut away for convenience of illustration.
Figure 6:
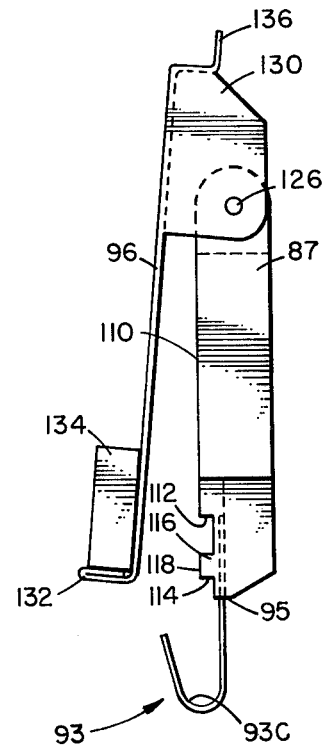
FIG. 6 is a right-side elevation view of the holding fixture 85 in FIG. 4 with parts 101 and 102 omitted for convenience of illustration.
Figure 7:
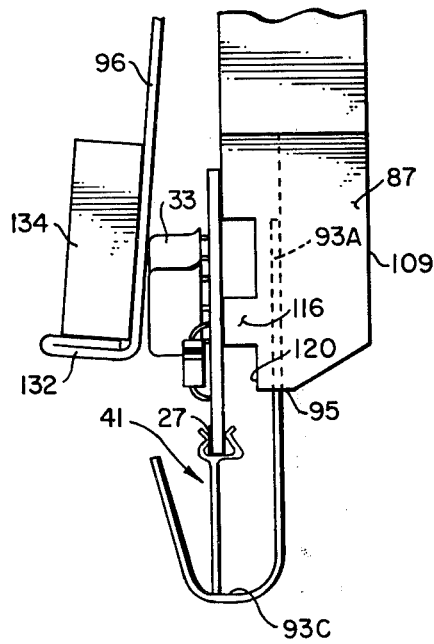
FIG. 7 is an enlarged view of a portion of the holding fixture 85 in FIG. 6 with a hybrid circuit 21 in FIG. 1 located in it.

A carousel type machine 51 for soldering lead frames 41 to substrates 23 is shown in FIG. 3 and comprises a plurality of arms 53 that are attached to a central hub 55 and extend radially from the center 57 thereof. Each of the arms 53 has a shaft 59 extending therefrom which may support a holding fixture 85 that is shown in more detail in FIGS. 4–6. The fixtures 84 hold hybrid assemblies 21 for dip soldering, as is shown in FIGS. 7 and 8. The machine 51 may be an Acculine rotary dipping convoy machine, Model RHV-360, manufactured by Hollis Engineering, Incorporated, of Nashua, N.H., and sold under the trademark Acculine, in which pins (not shown) are removed from the arms 53 to prevent rotation of the shafts 59 about the axes thereof, e.g., axis M—M in FIG. 3, when they are located in any one of the positions 1–8. The machine 51 has gears which rotate hub 55 in the plane of the paper and about point 57 for periodically advancing the arms 53 and associated holding fixtures 85 in 45° increments through positions 1–8. The machine employs pneumatic means for raising and lowering arms 53 and associated fixtures 85 at various positions.

Associated with the machine 51 is a flux station 61 that is located at position 3; an infrared heating station 62 at position 4; a wave solder station 63 at position 5; and a cleaning station 64 at position 7. A pair of the bins 69 and 71 holding hybrid assemblies having lead frames 41 thereon that are to be soldered and that have already been soldered, respectively, are located between positions 1 and 2. Since the stations 61–64 are conventional, they will be only briefly described here. The station 61 may be a pot 65 containing a flux bath or one in which a wave of flux is produced and that extends to a prescribed height in a plane perpendicular to the plane of the paper in FIG. 3. The station 62 includes a pair of lamps 72A and 72B which preheat the lead frames 41 and substrates in fixtures 84. The station 63 preferably produces a solder wave 77 having a top surface area which is flat and which extends to a prescribed height as is generally illustrated in the section view thereof in FIG. 8. Generally, molten solder 75 in a pot 73 is moved by a pump 79 through apertures in a plate 81 to form the solder wave 77 having a depth of say one inch. A pair of end plates, only one plate 83 being shown in FIG. 8, define the breadth of the wave, which is generally flat between the end plates. The station 64 is a pot 66 of solvent for cooling, defluxing, and cleaning the substrates and leads. The machine 51 is programmed by a flow control value to lower the arms 53 a predetermined amount in a plane through the point 57 and perpendicular to the plane of the paper in FIG. 3 when they are advanced to the stations at positions 3, 5 and 7. The arms are held in the lowered position for a prescribed time interval before they are again raised.

Referring now to FIGS. 4–7, the holding fixture 85 comprises a flat plate 87 having a plurality of clip or hook elements 91, 92 and 93 extending below the bottom 95 thereof, having a weighted cover 96 that is rotatably attached to flanges 98 and 99 on the top thereof, and having a two-piece mounting and alignment assembly comprising parts 101 and 102 that is attached to the left-side 103 of the reduced height or dimension section 104 thereof. The plate may be manufactured from a 3 inch×8 inch×⅛ inch bar of 6061-T6 aluminum which is black anodized to prevent it contaminating the solder at station 63 and to prevent solder adhering to it. The left-edge 103 of the plate 87 is preferably perpendicular to the bottom 95 thereof. A plurality of recesses 106, 107 and 108 are milled in the front 110 of the plate at right angles with respect to the bottom 95 for receiving the flat one ends 91A, 92A and 93A of associated hook elements. They may be secured in the recesses by flathead screws. Alternatively, they may be welded to plate 87. The other ends 91B, 92B and 93B of the hook elements are U-shaped to form hook portions having bases or bottoms 91C, 92C and 93C which are in a straight line N—N that is preferably parallel to the bottom 95 of the plate. The arms of the hook portions are bent back over the shanks. The elements 91-93 may be stamped from ⅜th inch×2 inch×0.030 inch strips (22 gauge) of commercially pure titanium so that solder will not adhere to them. Alternatively, they may be made of the same material as music wire.

An array of hybrid assemblies 21 is located in the fixture 85 with the base 43 of a lead frame 41 contacting the flat bottoms 91C–93C of the hook portions, as is shown in FIGS. 7 and 8. The depth of the recesses 106-108 may be equal to the thickness of the flat end portions of the hook elements so that the backside 35 of a substrate will be flush with the front 110 of the plate. In a preferred embodiment of the invention, the recesses 106-108 are deeper than the thickness of the flat end portions 91A–93A of the hook elements, as is shown in FIGS. 6 and 7. A pair of slots 112 and 114 are then milled in the front 110 of the plate to form a rib 116 that extends over the full length of the plate. The top surface 118 of rib 116 is in the same plane as the front 110 which is then spaced from the bottom 120 of the lower slot 114 and from the bottom 95 of the plate. In this manner, air gaps are formed by slots 112 and 114 between the backs 35 of substrates in the fixture 85 and the front 110 of the plate to prevent flux wicking up the back 35 of a substrate during soldering so as to prevent a hybrid sticking to the fixture and becoming difficult to remove from it. Inserts (not shown) may be located over the flat ends 91A–93A of the hook elements in the recesses 106–108 to make the surface 118 of rib 116 continuous over the length of the plate, although this has not been found necessary.

In order to hold a substrate 23 securely in a fixture 85, the hinged cover 96 rests on components of hybrid assemblies 21. The cover may be stamped out of a sheet of 22-gauge (0.030 inch) stainless steel and formed in the shape shown in FIGS. 4 and 5. A slot 122 is milled in the top edge of the plate to form the flanges 98 and 99 which have axially aligned holes therein. The cover 96 is pivotally mounted on the plate by Dowell pins 124 and 126 which extend through the holes in flanges 98 and 99, and the sides 128 and 130 of the cover. A flange or lip 132 on the bottom edge of the cover supports a bar 134 which operates as a weight to hold the cover against a substrate located in the fixture. A lip 136 on the top of the cover provides a finger grip for rotating the cover and the weighted bottom edge 132 thereof away from the plate so that substrates may be loaded into or removed from the fixture.

It is desirable that the line N—N through the bases 91C–93C of hook elements and the base 43 of a lead frame 41 be parallel to the flat surface area of the solder wave in pot 73. The two-piece mounting assembly 101–102 is employed to facilitate obtaining the desired alignment of the bottoms of the hook elements with the top surface of the solder wave, as is described more fully hereinafter. This mounting assembly, which interconnects plate 87 with an arm 53 of the machine 51, comprises a round-support flange 101 and a mounting collar 102.

The flange 101 has an elongated slot 138 in one side 139 thereof. The left-edge 103 of the reduced height section 104 is located in slot 138 with the edge 103 flush with the bottom 153 of the slot. The parts 87 and 101 are rigidly secured together by socket head screws 140A and 140B which extend through holes in flange 101 and are threaded into holes 141A and 141B in the left-edge 103 of the plate (see FIGS. 4 and 5). Threaded holes 143 are formed at 120° intervals in the left-side 142 of part 101 (see FIG. 5). Threaded holes 144 that are spaced at 120° intervals and extend all the way through the flange 101 have Allen screws 145 threaded therein from the side 139. The collar 102 has the same outer diameter as flange 101 and is attached to the latter by socket-head screws 146 which extend through holes 147 therein and are threaded into associated holes 143 in the flange 101. The diameter of the holes 147 in collar 102 are preferably greater than the diameter of the screws therein. Bores 151 and 152 are formed in collar 102 and flange 101 with axes that are perpendicular to the bottom 153 of slot 138 and the sides 156 and 158. The bores 151 and 152 have the same diameter which provides a slip fit over a shaft 59 on an associated arm 53 of the machine in FIG. 3. An Allen screw 154 is threaded into an opening 155 (see FIG. 5) and a keyway (not shown) in an associated shaft 59 to hold the collar 102 and flange 101 and other parts of a fixture 85 on an arm 53 of machine 51. The position of the bottom 95 of plate 87 in the vertical plane is adjusted for making the line N—N parallel to the surface of the solder wave by loosening the screws 146 and selectively tightening or loosening the Allen screws 145 against the side 156 of the collar 102 to tilt the plate 87 and flange 101 with respect to it.

The operation of the machine 51 for soldering lead frames 41 to substrates 23 will now be briefly described. An operator manually rotates the cover 96 of a holding fixture 85 up away from the front 110 of the associated plate 87 and removes a soldered hybrid circuit, or group thereof, from it and places the soldered hybrid in box 69. The operator then takes a hybrid assembly from box 71 and places it in the fixture 85 with the base 43 of the lead frame contacting the flat bases 91C–93C of the hook elements, the back 35 of the substrate contacting the surface 118 of rib 116. After the cover 96 is lowered against a substrate or component thereon to hold it in place, the machine sequentially advances holding fixture 85 through positions 2–8. At position 3, the fixture is lowered sufficiently into the flux bath there to wet the lead frame 41 and lands 27 on the substrate. The fluxed assembly 21 is preheated by infrared light at position 4. The machine advances fixture 85 and the heated-fluxed hybrid assembly to position 5 where only the hook portions of elements 91–93, the lead frame 41 and the portion of substrate 23 containing lands 27 are lowered into the wave 77 of 225° C. molten solder for approximately two seconds. The holding fixture is then raised out of the solder bath and advanced to position 7 where the soldered substrate is totally immersed in a solvent at station 64 which cools, cleans and defluxes the substrate and lead frame.

In a machine 51 that included eight holding fixtures 85 and stations 61–64 and that was successfully operated, each of the fixtures 85 was dimensioned for holding a group of three substrates 23 prior to their being separated. The elements 91–93 were formed of 0.030 inch thick commercially pure titanium and located in 0.156 inch deep recesses 106–108 such that the flat bottoms 91C–93C of the elements were approximately ⅜ inch below the bottom 95 of the plate. The hook elements were centered 2.5 inches apart. The slots 112 and 114 were 0.250 inch and 0.090 inch wide and approximately 0.060 inch deep to define a rib 116 that was approximately 0.160 inch wide. The fixtures 85 dipped substrates into 225° C. molten solder only far enough to fully cover the lands 27 which extended approximately 0.080 inch above the bottom 31 of the substrate. The elements 91–93, lead frames 41, substrate edge 31 and lands 27 were held in the solder for approximately two seconds. Lead frame fingers were successfully soldered to substrate lands 27 without causing components 33 already soldered to circuit patterns and within 0.020 inch from the lands becoming unsoldered and falling off or being moved on the substrate.

Although this invention is described in relation to preferred embodiments thereof, variations and modifications thereof will be apparent to those skilled in the art. By way of example, automatic means may be used to load substrates into and remove them from the holding fixture. This could be accomplished pneumatically. Also, the one ends of the hook elements may be connected to the back 109 of the plate and loop under the bottom 95 and open over the front side 110 thereof. Further, the plate 87 may be held by other than the left-side 103 thereof, e.g., by the back or top, and still provide the desired alignment adjustment. Additionally, the function of cover 96 may be accomplished by other structure such as a plate having one end thereof bent at an acute angle to form a lip which rests on the top of plate 87 or a flange on the front 110 thereof. Further, a thin strip of material which runs the length of plate 87 and parallel to rib 116 may be attached to the front 110. The spacing of this strip from the line N—N is selected to be sufficient to hold a substrate 23, which does not have components thereon but which does have a lead frame 41 attached thereto, so that it does not slide around in fixture 85 when it is lowered into the solder. The scope of this invention is therefore defined by the appended claims, rather than by the aforementioned detailed description.

I claim:

1. In a dip solder machine including means for moving a portion of a work piece into and out of a molten solder bath, apparatus for holding in a generally upright position a hybrid assembly work piece including a substrate which may have electrical components soldered to conductive patterns on one side thereof at positions spaced at least a prescribed distance from conductive lands on the one side and adjacent to one edge of the substrate and an elongated lead frame having a conductive bar and a plurality of parallel leads projecting therefrom in the same direction with fingers on free-ends of leads fitting over the one edge of the substrate and at least some fingers contacting associated lands on the substrate for dip soldering lead frame fingers to associated lands, comprising;

a plate oriented in a generally upright position;
a plurality of hook elements each comprising a relatively straight shank portion connecting one end portion thereof to a curved hook portion having a base and an arm extending from the base in the general direction of the shank portion;
means for attaching the one end portions of said hook elements to said plate with the hook portions opening in the same-one direction and their bases all in the same-one line that is substantially perpendicular to the one directipn; and
means cooperating with said plate for supporting a substrate in a generally upright positon next to said plate with the bar of a lead frame on the substrate contacting hook element bases as said apparatus is moved generally in the direction opposite the one direction to place the hook portions and lead frame in molten solder and removed therefrom for soldering lead fingers to associated lands.

2. In a dip solder machine including means for moving a portion of a work piece into and out of a molten solder bath, apparatus for holding in a generally upright position a hybrid assembly work piece including a substrate which may have electrical components soldered to conductive patterns on one side thereof at positions spaced at least a prescribed distance from conductive lands on the one side and adjacent to one edge of the substrate and an elongated lead frame having a conductive bar and a plurality of parallel leads projecting from the bar in the same direction with fingers on free-ends of leads fitting over the one edge of the substrate and at least some fingers contacting associated lands on the substrate for dip soldering lead frame fingers to associated lands, comprising:
a first place oriented in a generally upright position;
a plurality of hook elements each comprising a relatively straight shank portion connecting one end portion thereof to a curved hook portion having a base and an arm extending from the base in the general direction of the shank portion;
means for attaching the one end portions of said hook elements to said first plate with the hook portions opening in the same-one direction and their bases all in the same-one line that is substantially perpendicular to the one direction; and
a second plate cooperating with said first plate for supporting a substrate in a generally upright position next to the first plate with the bar of a lead frame on the substrate contacting said hook element bases, said second plate contacting one of the substrate or a component thereon for maintaining the position of the substrate relatively fixed in the apparatus as it is moved generally in the direction opposite the one direction to place the hook portions and lead frame in molten solder and removed therefrom for soldering lead fingers to associated lands.

3. Apparatus according to claim 2 wherein said hook elements are made of a nonsolderable material.

4. Apparatus according to claim 3 wherein said hook elements are made of at least commercially pure titanium.

5. Apparatus according to claim 3 wherein said hook elements are made of music wire.

6. Apparatus according to claim 3 wherein said hook elements are made of sheet stock.

7. Apparatus according to claim 3 wherein said second plate is suspended from said first plate at points thereon that are spaced in the one direction from the bases of said hook elements.

8. Apparatus according to claim 7 including mechanical means for tilting the first plate for making the one line substantially parallel to the surface of the molten solder.

9. Apparatus according to claim 3 wherein said second plate is a cover that is hingedly attached to said first plate at points thereon that are spaced in the one direction from the bases of said hook elements.

10. Apparatus according to claim 3 wherein said hook portions open with arms spaced from one side of said first plate for supporting the substrate with the back thereof against the one side of said first plate, said first plate having an elongated slot in the one side thereof and contacting the back of the substrate and extending a distance which is greater than the length of the substrate in the same general direction as the one line and in a common plane.

11. A machine for receiving a hybrid assembly including a substrate which may have electrical components soldered to conductive patterns on one side thereof at positions spaced at least a prescribed distance from conductive lands on the one side and adjacent to one edge of the substrate and an elongated lead frame having a conductive bar and a plurality of parallel leads projecting therefrom in the same direction with fingers on free-ends of leads fitting over the one edge of the substrate and at least some fingers contacting associated lands on the substrate for dip soldering lead frame fingers to associated lands, comprising:
means producing a relatively flat surface area of molten solder;
means for holding a hybrid substrate and lead frame assembly comprising a first plate; a plurality of hook elements each having a relatively straight shank portion connecting one end thereof to a curved hook portion having a base and an arm extending back in the general direction of the shank portion;
means for attaching the one ends of said hook elements to said plate with hook portions opening in the same one direction and bases in the same one line that is substantially perpendicular to the one direction; and a second plate cooperating with the first plate for contacting one of the substrate or a component on a substrate, with a lead frame pressed over the one edge thereof, located in said holding means with the lead frame bar contacting the base portions of hook elements; and
means for moving the holding means to place the hook portions, the lead frame, and the one substrate edge and adjacent lands on a hybrid substrate in said holding means into molten solder and then removing them from the solder for soldering lead fingers to associated lands.

12. The machine according to claim 11 wherein said hook elements are made of a nonsolderable material.

13. The machine according to claim 12 including flux station means and cleaning station means, said moving means successively moving the holding means to said flux station means for applying flux to lead frames and lands of a substrate in said holding means, moving the holding means to the solder means, and moving the holding means with a soldered substrate therein to said cleaning station means for cleaning and defluxing the substrate and lead frame.

14. The machine according to claim 13 wherein said second plate is hingedly secured to said first plate for rotation into contact with one of the substrate and a component thereon.

15. The machine according to claim 11 including means for attaching said holding means to said moving means and operable for selectively providing tilt of said holding means in a generally vertical plane for making the one line substantially parallel to the surface of the solder when the hook portions are dipped in the solder.

16. The method of attaching lead frames to a hybrid substrate, the lead frame having a conductive bar and a plurality of parallel leads projecting therefrom in the same direction with fingers on the free-ends of the leads fitting over one edge of a hybrid substrate and associated conductive lands on one side of the substrate, comprising the steps of:

loading a hybrid substrate having a lead frame pressed over one edge thereof into a holder comprising a support plate; a plurality of hook elements each having one end thereof attached to the first plate and hook portions opening in the same one direction, with bases of hook elements being in the same one line that is substantially perpendicular to the one direction; and a cover supported by the first plate at points thereon spaced in the one direction from the bases of hook elements and extending over the substrate and contacting one of the latter and a component thereon for maintaining the position of the substrate in the holder with the lead frame bar contacting bases of hook elements;

moving the holder to a flux station for fluxing the lead frame and portion of the substrate supporting lands;

heating the fluxed lead frame and substrate in the holder;

advancing the holder containing a substrate with heated and fluxed lead frame and lands to a solder station;

moving the holder to dip hook portions and lead frame and lands on a substrate in the holder in molten solder;

removing the holder and substrate from the molten solder;

advancing the holder to a cleaning station for defluxing the holder, lead frame and substrate; and unloading the soldered substrate and lead frame assembly from the holder.

* * * * *